United States Patent [19]

Sivan et al.

[11] Patent Number: 5,358,890
[45] Date of Patent: Oct. 25, 1994

[54] PROCESS FOR FABRICATING ISOLATION REGIONS IN A SEMICONDUCTOR DEVICE

[75] Inventors: Richard D. Sivan; James R. Pfiester, both of Austin, Tex.

[73] Assignee: Motorola Inc., Schaumburg, Ill.

[21] Appl. No.: 47,933

[22] Filed: Apr. 19, 1993

[51] Int. Cl.$^5$ .................................... H01L 21/302
[52] U.S. Cl. .................................. 437/64; 437/69; 437/238
[58] Field of Search .................... 437/64, 69, 238; 148/DIG. 85, DIG. 86, DIG. 117; 257/506, 509, 519

[56] References Cited

U.S. PATENT DOCUMENTS

| | | | |
|---|---|---|---|
| 4,085,498 | 4/1978 | Rideout | 437/69 |
| 4,277,882 | 7/1981 | Crossley | 29/571 |
| 4,435,895 | 3/1984 | Parrillo et al. | |
| 4,494,304 | 1/1985 | Yoshioka | 29/578 |
| 4,987,093 | 1/1991 | Teng et al. | 437/69 |
| 5,024,961 | 6/1991 | Lee et al. | 437/34 |
| 5,091,332 | 2/1992 | Bohr et al. | 437/69 |
| 5,173,438 | 12/1992 | Sandhu | 437/63 |
| 5,240,874 | 8/1993 | Roberts | 437/69 |
| 5,242,849 | 9/1993 | Sato | 437/69 |

OTHER PUBLICATIONS

T. Nishihara, et al., "A 0.5 Micron Isolation Technology Using Advanced Poly Silicon Pad LOCOS (APPL)", IEEE-IEDM, 1988, 100-102.
H. Mikoshiba, et al., "A Novel CMOS Process Utilizing After-Gate-Implantation Process" pp. 41-42, VLSI Symp. 1986, San Diego, Calif.
R. Eklund, et al. "A 0.5 Micron BiCMOS Technology for Logic and 4Mbit-class SRAM's" IEEE-IEDM, 1989, 425-428.
K. Sunouchi, et al., "A Surrounding Gate Transitor (SGT) Cell for 64/256Mbit DRAMs" IEEE-IEDM, 1989, 23-26.
P. A. van der Plas, et al., "Field Isolation Process for Submicron CMOS", 19-20 1987 VLSI Symp., Karuizawa, Japan.
M. Seirodski, MeV Ion Implant Applications presentation—Genus General Ionex, Feb. 24, 1989.
K. Kanba, et al., "A 7 Mask CMOS Technology Utilizing Liquid Phase Selective Oxide Deposition" IEEE-IEDM, 1991, 637-640.
L. C. Parrillo, et al., "Twin-Tub CMOS II-An Advanced VLSI Technology" IEEE-IEDM, 1982, 706-709.
J. Hayden, et al., "A High-Performance Sub-Half Micron CMOS Technology For Fast SRAMS" IEEE-IEDM, 1989, 417-420.

*Primary Examiner*—Olik Chaudhuri
*Assistant Examiner*—Brian K. Dutton
*Attorney, Agent, or Firm*—Jasper W. Dockrey

[57] ABSTRACT

A process for forming isolation regions (20) having a self-aligned channel-stop (22) formed by implanting dopant atoms (24) through the isolation regions (22). An isolation mask (15) is formed over an active region (16) in a semiconductor substrate (10). The isolation mask can be constructed from a variety of materials including silicon nitride, silicon oxynitride, boron nitride, polysilicon, and germanium oxide. Thick isolation regions (20) are formed on either side of the isolation mask (15) and an ion implant process is carried out to form doped regions (22) in the substrate (10) immediately below the isolation regions (20). The isolation mask (15) prevents dopant atoms (24) from entering the active region (16) of the substrate (10).

18 Claims, 2 Drawing Sheets

PROCESS FOR FABRICATING ISOLATION REGIONS IN A SEMICONDUCTOR DEVICE

FIELD OF THE INVENTION

This invention relates in general to a method for fabricating a semiconductor device, and more particularly, to a method for forming isolation regions in a semiconductor device.

BACKGROUND OF THE INVENTION

In the manufacture of semiconductor devices, typically thousands of individual transistor devices are formed upon a single silicon substrate. These devices are interconnected to form complex circuits, also known as integrated circuits, as required for a particular circuit design. Because the transistors are formed within the same substrate, the transistors must be electrically isolated except as interconnected according to the circuit design; otherwise, undesired electrical connections between the transistors would cause circuit shorts. Several methods exist for device isolation and vary with the type of device being manufactured. One device isolation method widely used in the manufacture of insulated gate field effect transistors (IGFET) is the well known localized oxidation of silicon, or LOCOS, process.

In a typical LOCOS process, a thin silicon oxide layer, or pad oxide, is grown over a silicon substrate, and then a silicon nitride layer is deposited over the silicon oxide layer. Next, the pad oxide and nitride layer are patterned by known photolithographic techniques to partially expose the substrate. The exposed regions of the substrate are known as the field regions. Regions of the substrate still covered with the pad oxide and nitride are known as the active regions and will eventually contain the transistors for the integrated circuit. A thick silicon oxide insulator, or field oxide, is grown in the field regions of the silicon substrate by placing the substrate in a steam ambient, typically at a temperature in the range of 900° to 1100° C., for an extended time. The steam reacts with the exposed silicon to form silicon oxide. The thick field oxide provides electrical isolation by increasing the threshold voltage in the field region, thereby preventing the formation of a conductive path in the surface of the underlying silicon substrate. The active regions remain unoxidized and covered by nitride during the field oxide growth. Finally, the nitride and pad oxide are removed. Transistors are then formed by additional processing in the active region.

The continuing trend in integrated circuit design is to further increase the packing density of active devices on the silicon substrate. The density of active devices can be increased by shrinking some or all of the dimensions of the devices. One approach for increasing the packing density is the reduction of lateral separation distance between the active regions. However, as the lateral separation distance is reduced, the electrical isolation of adjacent active regions becomes more difficult. While the conventional field oxide structure is adequate to provide electrical insulation between adjacent active regions when the device separation distances are quite large, additional measures must be taken to ensure electrical isolation as the separation distances are reduced.

A well known technique for increasing the electrical isolation capability of a field oxide region is to place a doped region in the substrate below the field oxide region. This doped region is known as a channel-stop. The channel-stop functions to prevent electrical current from traversing between adjacent active regions below the field oxide. Typically, the channel-stop region is formed by implanting dopant atoms into the substrate region after patterning the nitride and pad oxide layers, and prior to growing the field oxide. In this way, the dopant is placed in the same locations of the substrate in which the field oxide regions will be formed. Although the dopant atoms are placed into the substrate using the patterned nitride and oxide layers as a doping mask, the dopant atoms can laterally diffuse through the substrate during the oxidation process used to form the field oxide regions.

The lateral diffusion process has the effect of dispersing the dopants in the substrate. At the elevated temperatures necessary to grow the field oxide regions, considerable lateral dopant diffusion can occur under the patterned nitride and pad oxide. Once the field oxidation process is complete and the nitride layer and pad oxide layer are removed, the active region of the substrate now contains a considerable dopant concentration from the lateral diffusion of implanted dopants. Additionally, the initial implanted concentration of dopants in the substrate region beneath the field oxide layer is reduced by the segregation of boron into the growing oxide layer. If the dopant concentration in the channel-stop region becomes too low, the channel-stop will not be able to perform its electrical current blocking function. This can lead to device failure from electrical coupling between adjacent active regions, known as punch-through. Although the channel-stop and field oxide structures remain viable isolation techniques, improvement in the isolation process is necessary to ensure adequate electrical isolation as the separation distances between adjacent active regions are reduced.

SUMMARY OF THE INVENTION

In practicing the present invention there is provided a process for forming isolation regions in a semiconductor substrate. The process provides highly defined doped regions in the semiconductor substrate immediately below the isolation regions. Furthermore, the process of the invention provides a high quality active region which is substantially free of the dopants used to form the doped regions below the isolation regions. In one embodiment of the invention, a semiconductor substrate is provided and an isolation mask is formed on the surface of the substrate. The isolation mask overlies an active region of the substrate. Exposed surface regions of the substrate extend away from the isolation mask on either side of the isolation mask. Dielectric isolation regions are formed in the exposed regions of the substrate surface on either side of the isolation mask. Dopant atoms are implanted into the substrate through the dielectric isolation regions to form doped regions in the substrate immediately below the isolation regions. The implant step is performed without removing the isolation mask, which substantially prevents dopant atoms from entering the active region.

Figure 1:
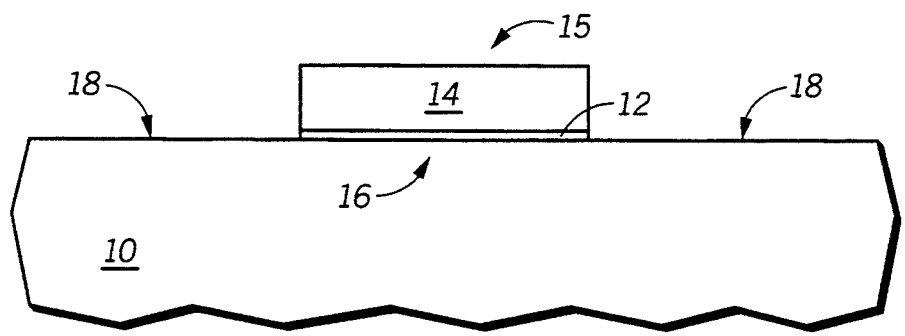
FIGS. 1–3 illustrate, in cross-section, process steps in accordance with one embodiment of the invention.

It will be appreciated that for simplicity and clarity of illustration elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF PREFERRED EMBODIMENTS

Figure 2:
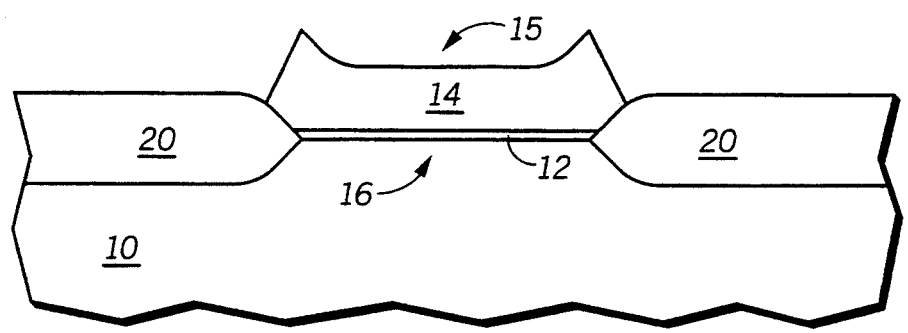
Figure 3:
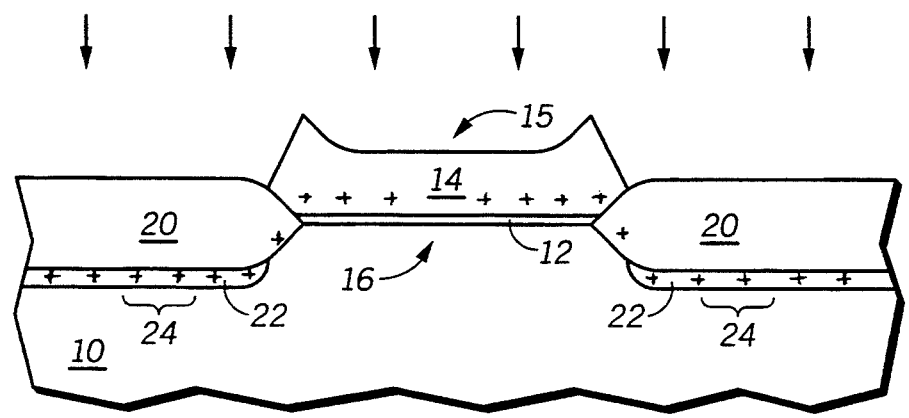

FIGS. 1-3 illustrate, in cross-section, a process for forming isolation structures in a semiconductor substrate in accordance with one embodiment of the invention. A composite oxidation mask 15 is formed over an active region 16 on the surface of semiconductor substrate 10. Isolation regions 20 are formed in the exposed surface regions 18 of substrate 10 on either side of composite isolation mask 15. Dopant atoms 24 are implanted through isolation regions 20 to form doped regions 22 in substrate 10 immediately below isolation regions 20. Composite mask 15 prevents dopant atoms 24 from entering active region 16 of substrate 10. The inventive process selectively places dopant atoms 24 into substrate 10 in regions immediately underlying isolation regions 20, while completely preventing dopant atoms 24 from entering active regions 16. Therefore, the lateral extent of doped regions 22 in substrate 10 corresponds exactly with that of isolation regions 20.

The process illustrated in FIGS. 1-3 provides a high degree of control of the amount of dopant atoms entering substrate 10. Typically, in a conventional isolation process, isolation regions are formed by heavily oxidizing the substrate after implanting dopant atoms into the substrate. Implanted dopant atoms, such as boron, segregate preferentially into the growing isolation region during the oxidation process. As a result of segregation of boron atoms into the isolation regions, the concentration of boron atoms in the substrate is reduced. If the dopant concentration in the regions of the substrate immediately below the isolation regions becomes too low, the doped regions will not be able to prevent electrical contact between adjacent active regions. This phenomenon is known as punch-through, which in severe cases, can lead to total device failure. The process of the invention avoids dopant loss from the substrate into the isolation regions by forming the isolation regions prior to introducing dopant atoms into the substrate. This process sequence advantageously enables the creation of a precisely controlled dopant concentration in the substrate. By providing a highly controllable concentration of dopant atoms in the substrate, the possibility of electrical punch-through is substantially reduced.

Additionally, in the case of thermal oxidation, introducing dopant atoms 24 into substrate 10 after isolation regions 20 are formed, reduces the lateral diffusion of dopant atoms 24 in substrate 10. By forming doped regions 22 after thermal processing is complete, a precisely defined region of high dopant concentration is obtained in substrate 10 beneath isolation regions 20 .

With reference to FIG. 1, masking layer 15 is formed on the surface of substrate 10. In the embodiment illustrated in FIG. 1, masking layer 15 includes a dielectric layer 12 and an overlying blocking layer 14. Masking layer 15 overlies an active region 16 within substrate 10. Exposed surface regions 18 extend away from masking layer 15 on either side of masking layer 15. In a preferred embodiment, dielectric layer 12 is silicon dioxide formed by oxidizing the surface of substrate 10. However, dielectric layer 12 is optional and can be omitted.

Blocking layer 14 is preferably silicon nitride formed by chemical vapor deposition. Alternatively, blocking layer 14 can be a silicon nitride-silicon oxide composite material, silicon oxynitride, boron nitride, polysilicon, germanium oxide, and the like.

Once dielectric 12 and blocking layer 14 are formed, a photolithographic pattern is defined on the surface of blocking layer 14, and an etching process is carried out to remove the unmasked portions of layers 12 and 14. The photolithographic and etching process configures masking layer 12 on the surface of substrate 10 to exactly overlie active region 16. Active region 16 will contain the electrically active components of an integrated circuit, such as transistors, resistors, and the like.

After defining masking layer 15, isolation regions 20 are formed, as illustrated in FIG. 2. In one embodiment of the invention, isolation regions 20 are formed by thermal oxidation. To function effectively in isolating adjacent active regions, the isolation regions must be sufficiently thick such that electrical isolation between adjacent active regions can be attained. Preferably, isolation regions 20 are formed to a thickness of about 1600 to 2500 angstroms. As illustrated in FIG. 2, portions of isolation region 20 push underneath masking layer 15 forcing the edges of masking layer 15 away from the surface of substrate 10. This phenomenon is known as oxide encroachment, or "bird's beak" encroachment. The thermal oxidation process is carried out at temperatures of about 900° to 1100° C., and for an extended time period depending upon the specific oxidation temperature and the desired final oxide thickness.

In an alternative method, isolation regions 20 can be formed by an ion deposition process, such as molecular ion beam deposition. Although a molecular ion beam deposition process has the advantage avoiding a heavy thermal oxidation, thermal annealing remains necessary to form a homogeneous region. However, in the case of molecular ion beam deposition, the encroachment illustrated in FIG. 2 is much less extensive.

In yet another isolation forming method, isolation regions 20 can be formed by selective deposition of silicon dioxide. The selective deposition can be performed by subjecting substrate 10 to a saturated silica solution. The deposition process proceeds in the liquid phase and is followed by thermal annealing to homogenize the silicon dioxide layer.

Following the formation of isolation regions 20, an ion implantation process is carried out to form doped region 22 in substrate 10. Implanted dopant atoms 24 are indicated by "+" symbols. Although dopant atoms 24 fully penetrate isolation region 20, dopant atoms 24 do not completely penetrate masking layer 15. The extent of the penetration of dopant atoms 24 into masking layer 15 is illustrated by the "+" symbols within isolation layer 14. As indicated in FIG. 3, the profile of dopant atones 24 tapers away from substrate 10 in the vicinity of active region 16. As a result of the ion stopping power of masking layer 15, highly concentrated regions of dopant atoms are formed in a precisely defined area below isolation region 20. Doped region 22 functions as a channel-stop to prevent electrical communication between active region 16 and other active regions in substrate 10 (not shown).

To prevent the dopant atoms from penetrating masking layer 15, the combined ion stopping power of layers 12 and 14 must be sufficient to prevent complete ion penetration. Those skilled in the art will appreciate that the stopping power of a given material depends on both the composition of the material, and on its thickness. Of particular importance in the present invention, is the ion stopping power of masking layer 15 relative to the thickness of the isolation regions 20. For example, in the case of boron, masking layer 15 must have sufficient ion stopping power to prevent boron atoms from penetrating through masking layer 15.

The specific acceleration energy that is used to implant the boron ions will be determined by the thickness of the isolation regions. Therefore, the combined ion stopping power of layers 12 and 14 must be sufficient to prevent boron atom penetration at the acceleration energy necessary to achieve penetration of the isolation regions. For example, the projected range of boron ions (Rp) in silicon dioxide, at an acceleration energy of 50 KeV, is about 1600 angstroms. To place the peak boron concentration in the substrate directly below the isolation region, the isolation region should have a thickness of about 1600 angstrom, or slightly less. Correspondingly, at 50 KeV, the Rp of boron in silicon nitride is about 1240 angstroms. However, to insure that no boron ions enter the substrate below the silicon nitride, the silicon nitride must be sufficiently thick to prevent even the highly straggled ions from penetrating the silicon nitride layer. At 50 KeV, the deepest penetration of boron ions is about 990 angstroms beyond the Rp of 1240 angstroms. Therefore, to insure all of the boron atoms are stopped in the silicon nitride layer, the silicon nitride is deposited to a thickness of about 2230 angstroms.

Those skilled in the art will appreciate that for different boron acceleration energies, and for different masking materials, the necessary masking thickness will change. Preferably, in the case of silicon dioxide isolation regions, the silicon nitride thickness ranges from about 2000 angstroms to 3200 angstroms. Also, dielectric layer 12 provides additional ion blocking capability. Preferably, dielectric layer 12 has a thickness of about 500 angstroms or less.

The exclusion of advantage dopant atoms from active region 16 has the advantage enabling a highly controlled effective width ($W_{eff}$) in the active transistors to be fabricated therein. By avoiding unwanted lateral diffusion of dopants from region 22 into active region 16, the total dopant concentration in the active regions can be predetermined by subsequent ion implantation steps. Therefore, the exact electrical characteristics of active region 16 can be more precisely controlled. Although the foregoing process description relates to the implantation of boron atoms, the inventive process is equally applicable to the implantation of different dopant atoms such as phosphorus, arsenic, antimony, gallium, and the like.

In another embodiment of the invention, the oxidation process used to form isolation region 20 is split into two separate steps. Following the formation of masking layer 15, an initial oxidation process is carried out to form isolation region 20 to a first thickness. Then, an ion implantation process is carried out to form doped regions 22 in substrate 10 below the first isolation thickness. As in the previous embodiment, dopant atoms are prevented from entering active region 16 by masking layer 15. After performing the ion implant step, a second oxidation process is performed to oxidize isolation regions 20 to a final thickness.

The split oxidation embodiment of the invention has the advantage that lower ion acceleration energies can be used to form dope regions 22. At a lower acceleration energy, less stopping power is need to prevent ions from entering active region 16. Accordingly, the thickness of masking layer 15 can be reduced. In addition, since only enough ion acceleration is required to penetrate the first isolation thickness, isolation region 20 can be formed to a large final thickness without requiring an excessive ion implantation acceleration energy. Although a slight amount of lateral dopant diffusion will occur during the second oxidation process, the total amount of lateral diffusion will be substantially less than in a conventional LOCOS process.

Figure 4:
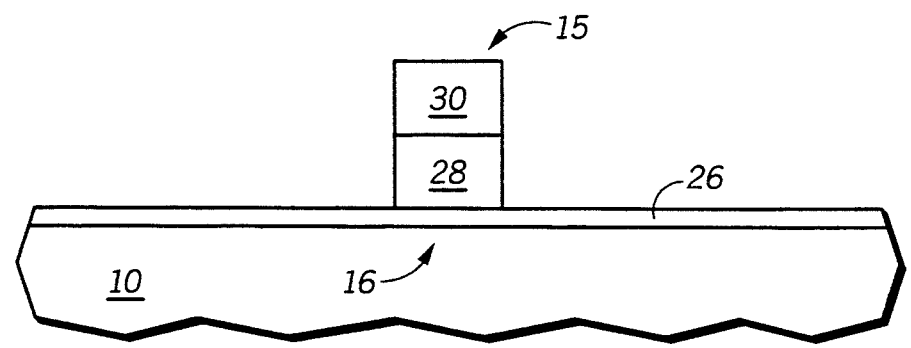
FIGS. 4–7 illustrate, in cross-section, process steps in accordance with another embodiment of the invention.

In yet another embodiment of the invention, different combinations of materials can be used to form masking layer 15. A composite masking layer, in accordance with the alternative embodiment, is illustrated in FIG. 4. The composite masking layer includes a pad oxide layer 26 overlying the surface of substrate 10, and a silicon nitride layer 28 overlying the pad oxide layer 26. A germanium oxide layer 30 overlies silicon nitride layer 28. Both silicon nitride layer 28 and germanium oxide layer 30 are preferably formed by chemical vapor deposition. The process sequence is straight forward. Pad oxide layer 26 is preferably formed by oxidizing the surface of substrate 10. Then, silicon nitride layer 28 is deposited to overly pad oxide layer 26. Once silicon nitride layer 28 is formed, germanium oxide layer 30 is deposited in a chemical vapor deposition apparatus using germane source gas. Alternatively, germanium oxide layer 30 can be formed by depositing a layer of silicon oxide, followed by ion implantation of germanium atoms into the silicon oxide layer.

Figure 5:
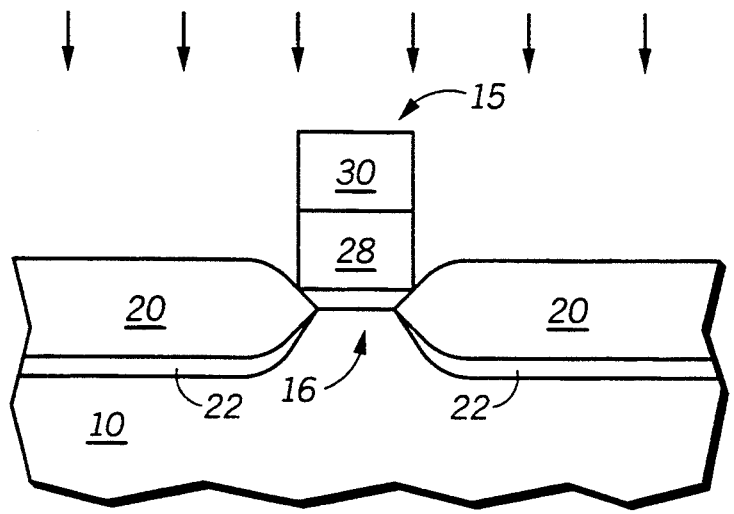
Figure 6:
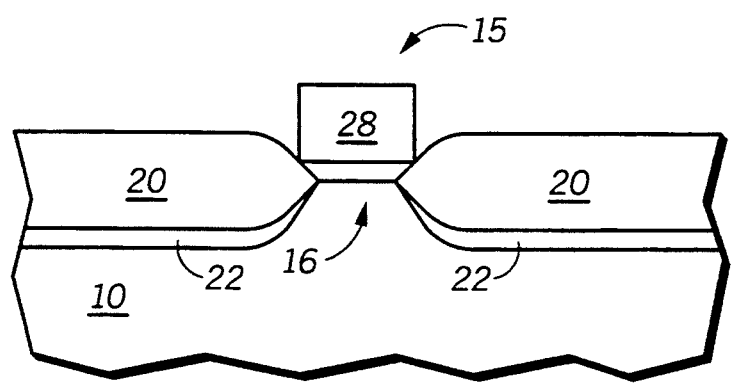

Once germanium oxide layer 30 is formed, isolation regions 20 are formed, as illustrated in FIG. 5. Preferably, a high-pressure oxidation (HiPOX) process is carried out to oxidize the surface of substrate 10. In the HiPOX process, the oxidation is performed at a pressure of about 1 to 25 atmospheres and a temperature of about 700° to 1000° C. The oxidation temperature is lower than a conventional LOCOS oxidation and avoids exposing the germanium oxide to excess temperatures. Alternatively, any of the previously described process methods can be used to form isolation regions 20, so long as the process temperature does not exceed the phase transition temperature of germanium oxide. Next, an ion implantation process is carried out to form doped region 22 in substrate 10 beneath isolation region 20. As illustrated in FIG. 5, doped region 22 underlies isolation region 20 and does not extend into active region 16.

The composite masking layer, illustrated in FIGS. 4 and 5, has the advantage of providing substantial ion stopping power while avoiding a large amount of compressive stress on the surface of substrate 10. By forming germanium oxide layer 30 over silicon nitride layer 28, high ion stopping power is achieved with a minimum thickness of silicon nitride. Reducing the amount of compressive stress on the silicon surface preserves the structural integrity of substrate 10 in active region 16. High compressive stress can cause dislocations in the silicon lattice. The dislocations can provide current leakage paths from active devices formed in active region 16.

Once the ion implantation process is complete and doped regions 22 are formed, germanium oxide layer 30 is removed. Preferably, germanium oxide layer 30 is removed by simply etching away the germanium oxide layer in water. Since germanium oxide is highly soluble in water, a simple water rinse is sufficient to remove germanium oxide from the surface of the substrate. Water rinsing provides a simple and effective method to remove germanium oxide layer 20, thereby making germanium oxide an ideal material for increasing the ion stopping power of masking layer 15.

After etching away germanium oxide layer 30, silicon nitride layer 28 is removed by either a wet or dry etching process. In one method, silicon nitride layer 28 is removed in a phosphoric acid etch bath. Alternatively, silicon nitride layer 28 can be removed reactive ion etching using fluorinated etching gases.

In a still further embodiment of the invention, a boron nitride layer is substituted for germanium oxide layer 30. The boron nitride layer can be deposited by chemical vapor deposition using, for example, diborane gas and ammonia. Following formation of isolation regions 20, the boron nitride layer can be removed by wet etching in a solution of water and hydrogen peroxide. Alternatively, a concentrated acid solution can be used, such as phosphoric acid, nitric acid, and the like. Again, as in the case of germanium oxide, the boron nitride layer is easily removed by a simple wet etching process.

Figure 7:
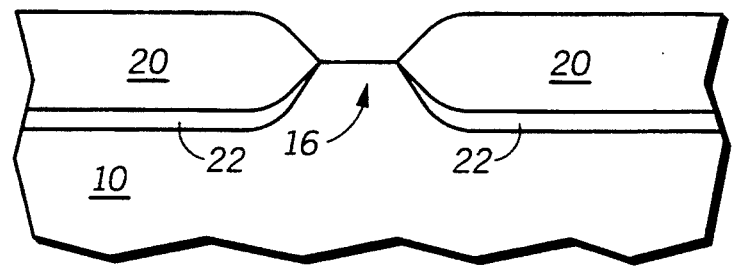

As illustrated in FIG. 7, following the removal of silicon nitride layer 28 and underlying pad oxide layer 26, the surface of active region 16 is exposed. Because of the reduced amount of stress created by the composite masking layer, the surface of active region 16 is free of dislocations and other stress induced defects. In addition, it is to be noted that doped region 22 substantially follows the contour of isolation region 20. As previously described, preventing dopant atoms from entering active region 16 has the advantage of enabling the fabrication of high quality devices in active region 16. Accordingly, the foregoing embodiment provides a high quality active region and precisely define doped regions underlying the isolation region.

Thus it is apparent that there has been provided, in accordance with the invention, a process for fabricating isolation regions in a semiconductor device which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the isolation regions can be recessed into the surface of the substrate. It is therefore intended to include within the invention all such variations and modifications as fall within the scope of the appended claims and equivalents thereof.

We claim:

1. A process for fabricating isolation regions in a semiconductor device comprising:
providing a substrate having a surface;
forming an isolation mask on the substrate surface to overlie
an active region and to leave exposed regions;
forming dielectric isolation regions in the exposed regions using a thermal oxidation process; and
implanting dopant atoms into the substrate through the
dielectric isolation regions to form doped regions immediately below the dielectric isolation regions and coextensive with the dielectric isolation regions and spaced apart from the active region,
wherein the implant step is performed without removing the
isolation mask, and
wherein the isolation mask substantially prevents the dopant
atoms from entering the active region.

2. The process of claim 1, wherein forming of an isolation mask comprises depositing a non-oxidizing material.

3. The process of claim 1, wherein forming of an isolation mask comprises depositing a material selected from the group consisting of silicon nitride, a silicon nitride-silicon oxide composite material, boron nitride, polysilicon, a silicon nitride-boron nitride composite material, and a silicon nitride-germanium oxide composite material.

4. The process of claim 1, wherein the implanting of the dopant atoms comprises implanting a dopant atom selected from the group consisting of boron, phosphorus, arsenic, antimony, and gallium.

5. A process for fabricating isolation regions in a semiconductor device comprising:
providing a substrate having a surface;
forming an isolation mask on the substrate surface to overlie an active region and to leave exposed regions;
forming a first portion of dielectric isolation regions in the exposed regions;
implanting dopant atoms into the substrate through the first portion of the dielectric isolation regions to form doped regions immediately below the dielectric isolation regions,
wherein the implant step is performed without removing the isolation mask, and
wherein the isolation mask substantially prevents the dopant atoms from entering the active region; and
forming a second portion of the dielectric isolation regions.

6. The process of claim 5, wherein the forming of the first and second portions of the isolation regions comprise thermal oxidation of the exposed regions.

7. The process of claim 6, wherein the implanting of the dopant atoms comprises implanting a dopant atom selected from the group consisting of boron, phosphorus, arsenic, antimony, and gallium.

8. A process for fabricating isolation regions in a semiconductor device comprising:
providing a substrate having a surface;
forming an oxidation mask on the substrate surface;
oxidizing the substrate to form dielectric isolation regions; and
implanting dopant atoms into the substrate through the dielectric isolation regions to form doped regions immediately below the dielectric isolation regions,
wherein the implant step is performed without removing the oxidation mask, and
wherein the oxidation mask substantially prevents the dopant atoms from entering the substrate, such that the doped regions are spaced apart by the oxidation mask.

9. The process of claim 8, wherein oxidizing the substrate comprises thermal oxidation at about 900° to 1100° C.

10. The process of claim 8, wherein the implanting of the dopant atoms comprises implanting a dopant atom selected from the group consisting of boron, phosphorus, arsenic, antimony, and gallium.

11. The process of claim 8, wherein the forming of an oxidation mask comprises a material selected from the group consisting of silicon nitride, silicon oxynitride, boron nitride, polysilicon, and germanium oxide.

12. A process for fabricating isolation regions in a semiconductor device comprising:
    providing a substrate having a surface;
    forming a pad oxide layer on the substrate surface;
    forming a silicon nitride layer to overly the pad oxide layer;
    forming a germanium oxide layer to overly the silicon nitride layer;
    patterning the germanium oxide layer and the silicon nitride layer to form an oxidation mask;
    oxidizing the substrate to form dielectric isolation regions;
    implanting dopant atoms into the substrate through the dielectric isolation regions to form doped regions immediately below the dielectric isolation regions; and
    removing the germanium oxide layer in a water rinse.

13. The process of claim 12, wherein the oxidizing of the substrate comprises thermal oxidation a pressure of about 1 to 25 atmospheres and at about 700 to 1000° C.

14. The process of claim 12, wherein the implanting of the dopant atoms comprises implanting a dopant atom selected from the group consisting of boron, phosphorus, arsenic, antimony, and gallium.

15. A process for fabricating isolation regions in a semiconductor device comprising:
    providing a substrate having a surface;
    forming a pad oxide layer on the substrate surface;
    forming a silicon nitride layer to overly the silicon oxide layer;
    forming a boron nitride layer to overly the silicon nitride layer;
    patterning the boron nitride layer and the silicon nitride layer to form an oxidation mask;
    oxidizing the substrate to form dielectric isolation regions;
    implanting dopant atoms into the substrate through the dielectric isolation regions to form doped regions immediately below the dielectric isolation regions; and
    removing the boron nitride layer in a wet etching solution.

16. The process of claim 15, wherein the wet etching solution comprises a solution selected from the group consisting of an aqueous, hydrogen peroxide solution, phosphoric acid, and nitric acid.

17. The process of claim 15, wherein the oxidizing of the substrate comprises thermal oxidation at about 900° to 1100° C.

18. The process of claim 15, wherein the implanting of the dopant atoms comprises implanting a dopant atom selected from the group consisting of boron, phosphorus, arsenic, antimony, and gallium.

* * * * *